United States Patent
Koty et al.

(10) Patent No.: US 11,844,290 B2
(45) Date of Patent: Dec. 12, 2023

(54) PLASMA CO-DOPING TO REDUCE THE FORMING VOLTAGE IN RESISTIVE RANDOM ACCESS MEMORY (RERAM) DEVICES

(71) Applicants: Tokyo Electron Limited, Tokyo (JP); International Business Machines Corporation, Armonk, NY (US)

(72) Inventors: Devi Koty, Hopewell Junction, NY (US); Qingyun Yang, Hopewell Junction, NY (US); Hongwen Yan, Yorktown Heights, NY (US); Hiroyuki Miyazoe, Yorktown Heights, NY (US); Takashi Ando, Yorktown Heights, NY (US); Marinus Johannes Petrus Hopstaken, Yorktown Heights, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 257 days.

(21) Appl. No.: 17/337,562

(22) Filed: Jun. 3, 2021

(65) Prior Publication Data
US 2022/0393107 A1    Dec. 8, 2022

(51) Int. Cl.
*H01L 45/00* (2006.01)
*H10N 70/00* (2023.01)
*H10B 63/00* (2023.01)

(52) U.S. Cl.
CPC ......... *H10N 70/041* (2023.02); *H10N 70/021* (2023.02); *H10B 63/00* (2023.02); *H10N 70/841* (2023.02); *H10N 70/8833* (2023.02)

(58) Field of Classification Search
CPC ... H10N 70/041; H10N 70/043; H10N 70/046
See application file for complete search history.

(56) References Cited

U.S. PATENT DOCUMENTS 10,991,881 B2 *  4/2021  Consiglio ............ H10N 70/883
2020/0203607 A1    6/2020  Koty et al.

FOREIGN PATENT DOCUMENTS

WO     2020243417     12/2020

OTHER PUBLICATIONS

Skaja et al., "Reduction Of The Forming Voltage Through Tailored Oxygen Non-Stoichiometry In Tantalum Oxide ReRam Devices", Scientific Reports, Jul. 2018, 7 pgs.

(Continued)

*Primary Examiner* — Mark V Prenty
(74) *Attorney, Agent, or Firm* — Egan, Enders & Huston LLP.

(57) ABSTRACT

Embodiments of process flows and methods are provided for forming a resistive switching random access memory (ReRAM). More specifically, process flows and methods are provided for reducing the forming voltage needed to form a conductive path in the ReRAM cells. A wide variety of plasma doping processes are used to introduce a plurality of different dopants into a metal-oxide dielectric film. By utilizing at least two different dopants, the plasma doping processes described herein reduce the forming voltage of the subsequently formed ReRAM cell compared to conventional processes that use only one dopant. In some embodiments, the forming voltage may be further reduced by applying a bias power during the plasma doping process, wherein the bias power is preselected to increase the number of ions introduced into the metal-oxide dielectric film during the plasma doping process.

21 Claims, 10 Drawing Sheets

(56) References Cited

OTHER PUBLICATIONS

Barlas et al., "Improvement Of HFO2 Based RRAM Array Performances By Local Si Implantation", IEEE, 2017, 5 pgs.
Barlas et al., "Impact Of Si/Al Implantation On The Forming Voltage And Pre-forming Conduction Modes In HFO2 Based OxRAM Cells", IEEE, 2016, 4 pgs.

* cited by examiner

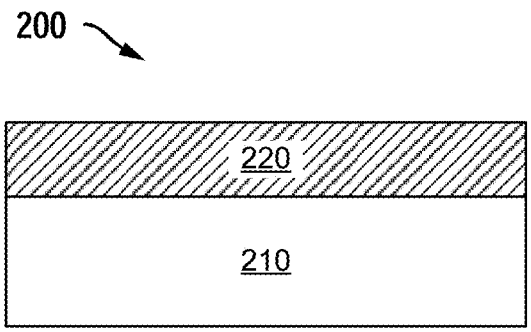 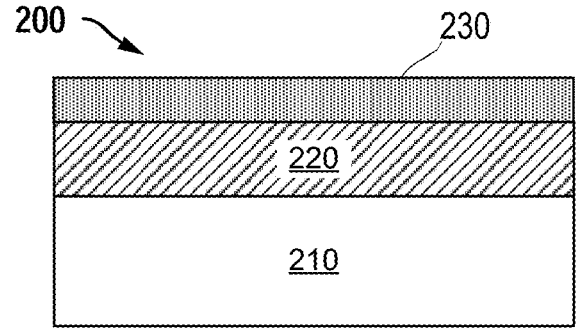
FIG. 2A    FIG. 2B
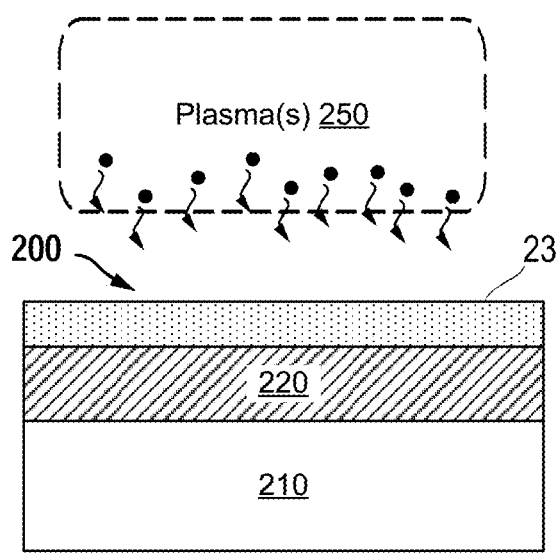 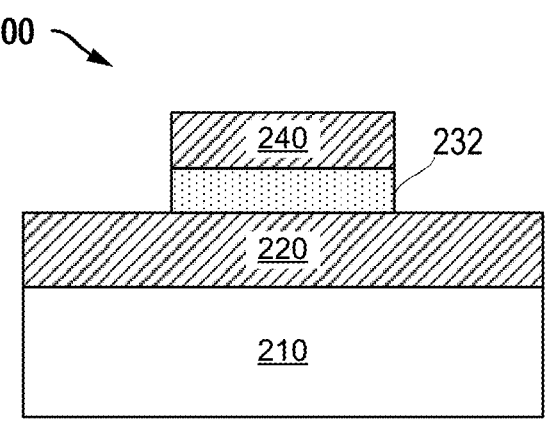
FIG. 2C    FIG. 2D

PLASMA CO-DOPING TO REDUCE THE FORMING VOLTAGE IN RESISTIVE RANDOM ACCESS MEMORY (RERAM) DEVICES

BACKGROUND

The present disclosure relates to the processing of substrates. In particular, it provides a method of forming memory cells on substrates.

A resistive switching random access memory (RRAM or ReRAM) is a type of non-volatile random access memory that is being considered for use in a variety of memory applications including electronic synapse devices, memristors for neuromorphic computing, high-density and high-speed non-volatile memory, and other applications.

FIG. 1 provides a simplified view of an ReRAM cell 100. As shown in FIG. 1, ReRAM cell 100 includes a laminate of a top electrode film 140, a dielectric film 130 and a bottom electrode film 120. The bottom electrode film 120 may be formed on a substrate 110. In some cases, the dielectric film 130 may comprise a metal oxide film, such as for example, hafnium oxide ($HfO_2$), zirconium oxide ($ZrO_2$), titanium oxide ($TiO_2$), nickel oxide (NiO), aluminum oxide ($Al_2O_3$), tantalum oxide ($Ta_2O_5$) and their mixtures. The top electrode film 140 and the bottom electrode film 120 may be formed, for example, of titanium nitride (TiN) or other metal layers. Other material layers not shown in FIG. 1 may also be included within the ReRAM cell, as is known in the art. It will also be recognized that the substrate 110 may comprise multiple patterned and unpatterned layers as is known in the art.

ReRAM devices utilize a resistive switching mechanism, which is based on a reversible resistance change of the dielectric film 130. This resistance change is a result, at least in part, of voltage-driven migration of mobile donors. In ReRAM devices, the dielectric film 130, which is normally insulating, can be made to conduct current through a "filament" (i.e., an electrically conductive path) formed after a sufficiently high voltage, known as the "forming voltage," is applied across the dielectric film thickness. The forming voltage is applied during an electroforming step, which creates "filaments" (e.g., conductive channels) in the lattice structure of the dielectric film 130. After the electroforming step is performed, the ReRAM device resistance can be switched between a high resistance state (HRS) and a low resistance state (LRS) by applying switching voltages to the ReRAM device to control the formation and dissolution of the conductive path.

In the ideal case, the forming voltage needed to form the conduction path would fall within the same range as the switching voltages, thereby providing a forming-free (or pre-formed) ReRAM cell. Unfortunately, high forming voltages (e.g., 2.0 V to 6.0 V) are often needed to form the conductive path within the dielectric film 130. These high forming voltages place electrical stress on the ReRAM cell, which reduces device performance. Therefore, it is important to reduce the forming voltage used to form ReRAM devices.

The forming voltage needed to form the conduction path generally depends on the thickness of the dielectric film and the initial resistance, which in turn, depends on the. These methods, however, increase leakage currents in the ReRAM cell, which in turn, may decrease the resistance window and lead to a degradation of reliability and data retention content of the dielectric film. In particular, the forming voltage increases with increasing dielectric film thickness. Accordingly, the forming voltage can be reduced, in some cases, by reducing the dielectric film thickness properties.

Another method that has been used to reduce the forming voltage in ReRAM devices is to introduce a dopant (or impurity) into the dielectric film. Known methods for introducing dopants into a material layer (i.e., doping) include diffusion and ion implantation all of which have particular advantages and disadvantages.

In some diffusion processes, a surface of the dielectric film may be exposed to a gas phase of dopant atoms, which diffuse into the surface up to a diffusion depth. The doping concentration decreases monotonically from the surface, and the in-depth distribution of the dopant is determined mainly by the temperature and diffusion time. For example, a metal-oxide dielectric film (e.g., $HfO_2$) may be exposed to a microwave hydrogen ($H_2$) gas (in a gas phase diffusion process) or a hydrogen/argon ($H_2$/Ar) plasma (in a plasma assisted diffusion process). In such processes, the $H_2$ atoms diffuse into the metal-oxide dielectric film to create additional defects in the dielectric film, which reduce the forming voltage needed to generate a conduction path across the dielectric film. However, introducing a dopant via diffusion may present several disadvantages for ReRAM devices as the doping concentration is non-uniform and the forming voltage may not be optimized.

Other methods to reduce the forming voltage in ReRAM devices have used ion implantation techniques to implant silicon (Si) ions into a metal-oxide dielectric film (e.g., $HfO_2$) at various dopant concentrations. In the proposed methods, a low acceleration voltage (e.g., 4 keV) was used to implant silicon ions into a 10 nm $HfO_2$ layer at dopant concentrations ranging from 0.1% to 5%. Although the forming voltage of the silicon implanted dielectric film was increased at lower dopant concentrations, a reduction of forming voltage was observed at higher dopant concentrations (e.g., 5%). While a reduction in forming voltage can be achieved via ion implantation of silicon ions, the ion implantation and/or post processing steps may damage the dielectric film.

It would be desirable to provide an improved process for forming an ReRAM device. More specifically, it would be desirable to provide an improved process for reducing the forming voltage in an ReRAM device.

SUMMARY

Embodiments of process flows and methods are provided for forming a resistive switching random access memory (ReRAM) device comprising a plurality of ReRAM cells. More specifically, improved process flows and methods are provided herein for reducing the forming voltage needed to form a conductive path in the ReRAM cells. In the disclosed embodiments, the forming voltage is reduced by using a variety of plasma doping processes (otherwise referred to as a plasma co-doping processes) to introduce a plurality of different dopants, such as a first dopant and a second dopant, into a dielectric film. By utilizing at least two different dopants, the plasma doping processes described herein reduce the forming voltage of the ReRAM cell compared to conventional processes that use only one dopant. In some embodiments, the forming voltage may be further reduced by selecting a bias power to be applied during the plasma doping processes described herein. Utilizing a bias power during a plasma doping process increases the ion content (or ion concentration) in the dielectric film and creates additional defects in the dielectric film that further reduce the forming voltage.

According to one embodiment, a method is provided herein for forming a resistive random access memory (ReRAM) device. The method may generally include: forming a first electrode layer on a substrate; forming a dielectric film on the first electrode layer; exposing the dielectric film to at least one plasma to introduce a plurality of dopants, including a first dopant and a second dopant, into the dielectric film to form a plasma doped dielectric film; and forming a second electrode layer on the plasma doped dielectric film. In some embodiments, the first dopant may be hydrogen and the second dopant may be silicon. By exposing the dielectric film to the at least one plasma, the method described herein may reduce a forming voltage needed to generate an electrically conductive path across the plasma doped dielectric film compared to the forming voltage needed to generate an electrically conductive path across the dielectric film.

In some embodiments, the first electrode layer and the second electrode layer may comprise titanium nitride (TiN), and the dielectric film may comprise a metal oxide selected from a group consisting of hafnium oxide ($HfO_2$), zirconium oxide ($ZrO_2$), titanium oxide ($TiO_2$), nickel oxide (NiO), aluminum oxide ($Al_2O_3$), tantalum oxide ($Ta_2O_5$) and their mixtures.

In some embodiments, said exposing the dielectric film to at least one plasma may comprise exposing the dielectric film to a single plasma comprising both hydrogen ions and silicon ions. In other embodiments, said exposing the dielectric film to at least one plasma may comprise exposing the dielectric film to a sequence of plasmas, the sequence of plasmas includes a first plasma comprising hydrogen ions and a second plasma comprising silicon ions.

In some embodiments, said exposing the dielectric film to at least one plasma may comprise delivering a hydrogen-containing processing gas and a silicon-containing processing gas to a plasma process chamber in which the substrate is disposed to generate the at least one plasma. In some embodiments, the hydrogen-containing processing gas may include a hydrogen (H2) gas or an H2 gas combined with one or more inert gases, and the silicon-containing processing gas may include a perhydridosilane (e.g., silane (SiH4), disilane (Si2H6), etc.), a hydridohalosilane, a halosilane (e.g., silicon tetrabromide (SiBr4), silicon tetrachloride (SiCl4), etc.), an aminosilane or other silicon precursors. In some embodiments, the hydrogen-containing processing gas and the silicon-containing processing gas may be delivered to the plasma process chamber at the same time to generate a single plasma containing both hydrogen ions and silicon ions. In other embodiments, the hydrogen-containing processing gas and the silicon-containing processing gas may be delivered to the plasma process chamber sequentially to generate a sequence of plasmas, and wherein each plasma in the sequence of plasmas contains only one reactive ion species.

In some embodiments, said exposing the dielectric film to at least one plasma may further include supplying a bias power to the plasma process chamber to increase an ion content in the plasma doped dielectric film. In some embodiments, the bias power may be preselected from a range consisting of 50 W to 500 W. By supplying a bias power to the plasma process chamber to increase an ion content in the plasma doped dielectric film, the method may further reduce the forming voltage needed to generate the electrically conductive path across the plasma doped dielectric film.

In some embodiments, said forming the dielectric film and said exposing the dielectric film to the at least one plasma may be performed in the same plasma process chamber. In some embodiments, the first electrode layer and the second electrode layer may also be formed within the same plasma process chamber in which the dielectric film is formed and exposed to the at least one plasma.

According to another embodiment, a method is provided herein for forming a resistive random access memory (ReRAM) device. The method may generally include: forming a first electrode layer on a substrate; depositing a dielectric film on the first electrode layer, wherein the dielectric film comprises a metal oxide; exposing the dielectric film to one or more plasmas containing hydrogen ions and silicon ions, wherein at least one of the one or more plasmas is generated while supplying a bias power to a plasma process chamber in which the substrate is disposed, and wherein said exposing creates a plasma doped dielectric film by introducing hydrogen and silicon dopants into the dielectric film; and forming a second electrode layer on the plasma doped dielectric film. By exposing the dielectric film to the one or more plasmas, the method described herein may reduce a forming voltage needed to generate an electrically conductive path across the plasma doped dielectric film compared to the forming voltage needed to generate an electrically conductive path across the dielectric film.

As noted above, the dielectric film may comprise a metal oxide. In some embodiments, the dielectric film may comprise a metal oxide selected from a group consisting of hafnium oxide ($HfO_2$), zirconium oxide ($ZrO_2$), titanium oxide ($TiO_2$), nickel oxide (NiO), aluminum oxide ($Al_2O_3$), tantalum oxide ($Ta_2O_5$) and their mixtures.

In some embodiments, one or more method steps may be performed after said exposing the dielectric film to the one or more plasmas and before said forming the second electrode layer on the plasma doped dielectric film. For example, the method may further comprise: depositing an additional dielectric film on the plasma doped dielectric film, wherein the additional dielectric film comprises a metal oxide; exposing the additional dielectric film to one or more plasmas containing hydrogen ions and silicon ions to introduce hydrogen and silicon dopants into the additional dielectric film; and repeating said depositing an additional dielectric film and said exposing the additional dielectric film to one or more plasmas until a desired thickness of the plasma doped dielectric film is reached.

In some embodiments, said exposing the dielectric film to the one or more plasmas may comprise delivering a hydrogen-containing processing gas and a silicon-containing processing gas to the plasma process chamber to generate the one or more plasmas. In some embodiments, the hydrogen-containing processing gas and the silicon-containing processing gas may be delivered to the plasma process chamber at the same time to generate a single plasma containing both the hydrogen ions and the silicon ions. In other embodiments, the hydrogen-containing processing gas and the silicon-containing processing gas may be delivered to the plasma process chamber sequentially to generate a sequence of plasmas, wherein each plasma in the sequence of plasmas contains only one reactive ion species.

As noted above, at least one of the one or more plasmas may be generated while supplying a bias power to the plasma process chamber, the bias power may be preselected from a range consisting of 50 W to 500 W. By supplying the bias power to the plasma process chamber, the method may increase an ion content in the plasma doped dielectric film and further reduce the forming voltage needed to generate the electrically conductive path across the plasma doped dielectric film.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 2A-2D illustrate one embodiment of a process flow used to form an ReRAM cell in accordance with the techniques described herein.

DETAILED DESCRIPTION

Figure 1:
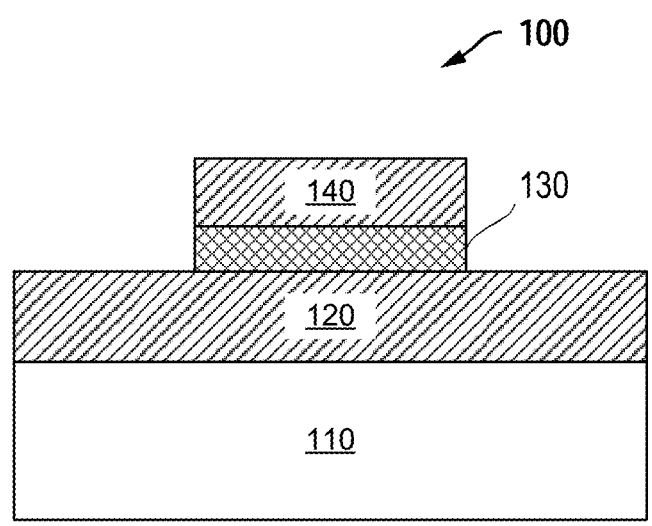
FIG. 1 (PRIOR ART) illustrates a simplified view an exemplary ReRAM cell.

Embodiments of process flows and methods are provided for forming a resistive switching random access memory (ReRAM) device comprising a plurality of ReRAM cells. More specifically, improved process flows and methods are provided herein for reducing the forming voltage needed to form a conductive path in the ReRAM cells. In the disclosed embodiments, the forming voltage is reduced by using a multiple dopant plasma doping process (otherwise referred to as a plasma co-doping process) to introduce a plurality of different dopants, such as a first dopant and a second dopant, into a dielectric film. In one example embodiment, hydrogen ($H_2$) ions and silicon (Si) ions may be introduced into a hafnium oxide ($HfO_2$) dielectric film using a variety of plasma doping processes. However, one skilled in the art would recognize how other combinations of dopants may be used when plasma doping other dielectric films.

The plasma doping processes described herein may utilize one or more plasma process steps to introduce a plurality of different dopants (or co-dopants) into a dielectric film, such as for example, a metal-oxide dielectric film. In some embodiments, a metal-oxide dielectric film may be exposed to a single plasma comprising both hydrogen ions and silicon ions. In other embodiments, a metal-oxide dielectric film may be exposed to a sequence of plasmas, wherein each plasma in the sequence contains only one ion species. For example, a metal-oxide dielectric film may be exposed to a hydrogen-containing plasma followed by exposure to a silicon-containing plasma (or vice versa). In some embodiments, a metal-oxide dielectric film may be exposed to a plasma (or a sequence of plasmas) after a desired thickness of the metal-oxide dielectric film has been formed (e.g., deposited) onto a bottom electrode layer of the ReRAM cell.

In other embodiments, the deposition and doping processing of the metal-oxide dielectric film may be performed by interrupting the deposition of the metal-oxide dielectric film at least once and performing the plasma exposure before continuing the deposition of the dielectric film. For example, a metal-oxide dielectric film may be initially deposited to a first thickness, which is less than the desired thickness. Once deposited to the first thickness, the metal-oxide dielectric film may be exposed to a first plasma process step (or a first sequence of plasma process steps) to introduce a plurality of different dopants (e.g., $H_2$ and Si ions) into the first thickness. Next, the deposition process may continue by depositing the metal-oxide dielectric film to a second thickness, which is greater than the first thickness. Once deposited to the second thickness, the metal-oxide dielectric film may be exposed to a second plasma process step (or a second sequence of plasma process steps) to introduce the plurality of different dopants (e.g., $H_2$ and Si ions) into the second thickness. The deposition and post-deposition processing of the metal-oxide dielectric film may continue until a desired thickness of the metal-oxide dielectric film is deposited and doped. Thus, a cyclical process of deposition/doping may be used, in some embodiments, to increase the uniformity of dopants introduced throughout the dielectric film thickness.

As mentioned above and described further below, the techniques described herein may utilize a wide variety of plasma doping processes to introduce a plurality of different dopants, such as a first dopant and a second dopant, into a metal-oxide dielectric film to reduce the forming voltage of the subsequently formed ReRAM cell. By utilizing at least two different dopants (e.g., $H_2$ and Si), the plasma doping processes described herein reduce the forming voltage of the ReRAM cell compared to conventional processes that use only one dopant (e.g., $H_2$ or Si). Though described herein in some examples with reference to $H_2$ or Si, it will be recognized that the forming voltage advantages described herein may be obtained through the use of other dopants.

In the present disclosure, the forming voltage is further reduced by selecting a bias power to be applied during the plasma doping process. In some embodiments, a bias power may be selected to increase the number of ions introduced into the metal-oxide dielectric film during the plasma doping process. In other words, a bias power may increase the ion content (or ion concentration) in the metal-oxide dielectric film. By increasing the ion content in the metal-oxide dielectric film, the techniques described herein may be used to create additional defects in the metal-oxide dielectric film that further reduce the forming voltage.

It is recognized that the techniques described herein may be utilized within a wide range of plasma processing systems. For example, the techniques may be utilized within a microwave plasma processing system, an inductively coupled plasma (ICP) processing system, a capacitively coupled plasma (CCP) processing system, an electron cyclotron resonance (ECR) plasma processing system or other type of processing system or combination of systems. The plasma processing system may also be used to perform a wide variety of plasma process operations including, but not limited to, plasma deposition, plasma doping, plasma etching, polymerization, atomic layer deposition (ALD), atomic layer etch (ALE) and so forth. In some embodiments, the deposition and doping processing of the dielectric film may be performed in-situ in the same plasma process chamber.

The techniques described herein may also be used with a wide range of ReRAM cell designs and ReRAM process flows. Exemplary process flows for forming an ReRAM cell are shown in FIGS. 2A-2D and FIGS. 3A-3F. Although one ReRAM cell is shown in the figures, it will be recognized that the illustrated process flows may be used to form a plurality of ReRAM cells included within an ReRAM device. It will be further recognized that the ReRAM process flows shown herein are merely exemplary and those skilled in the art will recognize other process flows may be used, while obtaining the advantages of the techniques described herein. Further, it will be recognized that many additional process steps may be utilized to complete a circuit design utilizing the ReRAM cell.

FIGS. 2A-2D illustrate one embodiment of a process flow that may be used to form an ReRAM cell 200 in accordance with the techniques described herein. In the embodiment shown in FIGS. 2A-2D, ReRAM cell 200 is provided on a substrate 210. The substrate 210 may be any substrate for which the etching of material is desirable. For example, the substrate 210 may be a semiconductor substrate having one or more semiconductor processing layers (all of which together may comprise the substrate) formed thereon. In one embodiment, the substrate 210 may be a substrate that has been subject to multiple semiconductor processing steps, which yield a wide variety of structures and layers, all of which are known in the substrate processing art. For example, the substrate 210 may be a semiconductor wafer including various structures and layers formed thereon. Although not shown for drawing clarity, the structures and layers included on/within the substrate 210 may include an ReRAM cell gate, source/drain regions, as well as various dielectric layers, conductor layers, vias and plugs, as is known in the art.

FIGS. 2A-2D illustrate the formation of an ReRAM cell stack including a bottom electrode layer 220, a dielectric film 230 and a top electrode layer 240. In one embodiment, the top electrode layer 240 and bottom electrode layer 220 may be formed, for example, of titanium nitride (TiN) or other metal layers. The dielectric film 230 may be formed from a variety of dielectric materials. In one example, the dielectric material is a metal oxide. In one embodiment, the dielectric film 230 may comprise hafnium oxide ($HfO_2$). It will be recognized, however, that other materials may also be utilized to form the material layers of the ReRAM cell stack. For example, the dielectric film 230 may include a metal-oxide dielectric film selected from a group consisting of zirconium oxide ($ZrO_2$), titanium oxide ($TiO_2$), nickel oxide (NiO), aluminum oxide ($Al_2O_3$), tantalum oxide ($Ta_2O_5$) and laminate films thereof. Other dielectrics may also be utilized.

In FIG. 2A, the bottom electrode layer 220 is formed on the substrate 210. The bottom electrode layer 220 may generally be formed using any known deposition process. For example, the bottom electrode layer 220 may be deposited onto a surface of the substrate 210 using chemical vapor deposition (CVD), physical vapor deposition (PVD), plasma enhanced chemical vapor deposition (PECVD), plasma enhanced physical vapor deposition (PEPVD), atomic layer deposition (ALD), etc.

In FIG. 2B, the dielectric film 230 is formed on the bottom electrode layer 220 as a blanket dielectric layer. The dielectric film 230 may generally be formed using any known formation process. For example, the dielectric film 230 may be deposited as a blanket dielectric layer onto a surface of the bottom electrode layer 220 using chemical vapor deposition (CVD), physical vapor deposition (PVD), plasma enhanced chemical vapor deposition (PECVD), plasma enhanced physical vapor deposition (PEPVD), atomic layer deposition (ALD), etc. In the embodiment shown in FIG. 2B, the dielectric film 230 is deposited to a desired thickness that provides an initial resistance across the dielectric film 230. The initial resistance depends on the content and thickness of the dielectric film used to form the dielectric film. In some embodiments, a desired thickness of the dielectric film 230 can be selected between 2 nm and 20 nm, between 2 nm and 10 nm or between 2 nm and 5 nm. In other embodiments, a desired thickness of the dielectric film 230 can be selected between 5 nm and 20 nm or between 10 nm and 20 nm. As deposited, the dielectric film 230 may contain intrinsic defects in the lattice structure of the dielectric material, such as oxygen vacancies or oxygen dislocations in a metal-oxide material.

In FIG. 2C, the dielectric film 230 is exposed to at least one plasma 250 to introduce a plurality of dopants into the blanket dielectric film layer and increase the number of defects in the lattice structure. More specifically, a plasma doping process (or plasma co-doping process) is performed in FIG. 2C to introduce a plurality of different dopants, such as a first dopant and a second dopant, into the dielectric film 230 blanket deposited across the bottom electrode layer 220 in FIG. 2B to form a plasma doped dielectric film 232. In one example embodiment, the plasma doping process shown in FIG. 2C may introduce both hydrogen ($H_2$) ions and silicon (Si) ions into the dielectric film 230 when the dielectric film is formed of hafnium oxide ($HfO_2$). Although $H_2$ and Si ions are provided herein as example co-dopants, one skilled in the art would recognize how other combinations of dopants may be used when plasma doping other metal-oxide films. Examples of other co-dopants that may be used in the plasma doping process described herein include, but are not limited to, zirconium (Zr), aluminum (Al), tantalum (Ta), titanium (Ti), niobium (Nb), lithium (Li), sodium (Na), calcium (Ca), magnesium (Mg), and carbon (C).

The plasma doping process shown in FIG. 2C may use one or more plasma process steps to introduce a plurality of co-dopants into the blanket deposited dielectric film 230 to form the plasma doped dielectric film 232. In some embodiments, the dielectric film 230 may be exposed to a single plasma 250 comprising, for example, both $H_2$ and Si ions. In other embodiments, the dielectric film 230 may be exposed to a sequence of plasmas 250, wherein each plasma in the sequence contains only one reactive ion species. For example, the dielectric film 230 may be exposed to a plasma 250 containing $H_2$ ions followed by exposure to another plasma 250 containing Si ions (or vice versa).

After the dielectric film 230 is exposed to at least one plasma 250 in FIG. 2C, the top electrode layer 240 may be formed on the plasma doped dielectric film 232 and the plasma doped dielectric film 232 and top electrode layer 240 may be patterned, to complete the ReRAM cell stack, as shown in FIG. 2D. The top electrode layer 240 may generally be formed using any known deposition process. For example, the top electrode layer 240 may be deposited onto a surface of the dielectric film 230 using chemical vapor deposition (CVD), physical vapor deposition (PVD), plasma enhanced chemical vapor deposition (PECVD), plasma enhanced physical vapor deposition (PEPVD), atomic layer deposition (ALD) etc. After the top electrode layer 240 is deposited and the plasma doped dielectric film 232 and top electrode layer 240 may be patterned to complete the ReRAM cell stack, additional processing steps may be performed to complete the ReRAM cell 200, as is known in the art.

A wide range of plasma processing systems may be utilized to perform the plasma doping process shown in FIG.

2C. In one embodiment, a microwave plasma processing system may be used to generate the at least one plasma 250. For example, the microwave plasma processing system 900 shown in FIG. 9 and described in more detail below is one example of a microwave plasma processing system that may be used to generate the at least one plasma 250. It is recognized, however, that the techniques described herein are not limited to the plasma processing system 900 shown in FIG. 9, or more generally to a microwave plasma processing system. In other embodiments, the plasma doping process shown in FIG. 2C may be alternatively performed within an inductively coupled plasma (ICP) processing system, a capacitively coupled plasma (CCP) processing system, an electron cyclotron resonance (ECR) plasma processing system, or other type of processing system or combination of systems. In some embodiments, the process steps shown in FIGS. 2A-2D may be performed in-situ in the same plasma process chamber.

Regardless of the particular system used, the at least one plasma 250 shown in FIG. 2C may be generated by delivering processing gases to a plasma process chamber, while supplying power from one or more power sources (e.g., source and/or bias power sources) to one or more electrodes contained within the plasma process chamber. The application of power generates a high-frequency electric field, which dissociates and converts the processing gases delivered to the process chamber into the at least one plasma 250.

In some embodiments, a single power source may supply source power to the plasma process chamber to generate the at least one plasma 250. In other embodiments, one or more power sources may supply source power and bias power to the plasma process chamber to generate the at least one plasma 250. A variety of different power sources (e.g., microwave power sources, RF power sources, etc.) may be used to generate the source and bias power. The source and bias power may be applied continuously to generate continuous wave (CW) plasmas, or may be pulsed to generate pulsed plasmas within the plasma process chamber. Pulsed plasmas can be generated by modulating the source power and/or the bias power in time, amplitude and/or phase.

A variety of processing gases may be supplied to the plasma process chamber to generate the at least one plasma 250 shown in FIG. 2C. In some embodiments, for example, a hydrogen-containing processing gas and/or a silicon-containing processing gas may be supplied to the plasma process chamber to generate the at least one plasma 250. Examples of a hydrogen-containing processing gas include an $H_2$ gas and an $H_2$ gas combination that includes an $H_2$ gas combined with one or more inert gases, such as helium (He), argon (Ar), etc. Examples of a silicon-containing processing gas include a perhydridosilane (e.g., silane ($SiH_4$), disilane ($Si2H6$), etc.), a hydridohalosilane, a halosilane (e.g., silicon tetrabromide (SiBr4), silicon tetrachloride (SiCl4), etc.), an aminosilane and other silicon precursors. In some embodiments, the hydrogen-containing processing gas and the silicon-containing processing gas may be delivered to the plasma process chamber at the same time to generate a single plasma 250 containing both $H_2$ and Si ions. In other embodiments, the hydrogen-containing processing gas and the silicon-containing processing gas may be delivered to the plasma process chamber sequentially to generate a sequence of plasmas 250, wherein each plasma in the sequence contains only one reactive ion species (e.g., $H_2$ ions or Si ions).

The plasma doping process shown in FIG. 2C introduces a plurality of co-dopants into the deposited dielectric film 230 to reduce the forming voltage of the subsequently formed ReRAM cell 200. Each dopant introduced into the dielectric film 230 creates additional defects in lattice structure of the plasma doped dielectric film 232. These additional defects reduce the forming voltage of the subsequently formed ReRAM cell 200 by increasing the density of the bulk defects participating in the charge transport through the plasma doped dielectric film 232. By utilizing at least two different dopants (e.g., $H_2$ and Si ions), the plasma doping process shown in FIG. 2C reduces the forming voltage of the ReRAM cell 200 compared to conventional processes that use only one dopant (e.g., $H_2$ or Si). In some embodiments, for example, the plasma doping process shown in FIG. 2C may reduce the forming voltage by about 0.1V to 1.0V compared to conventional processes.

In some embodiments, a bias power may be supplied to the plasma process chamber during the plasma doping process shown in FIG. 2C to further reduce the forming voltage of the ReRAM cell 200. Supplying bias power increases the energy of the ions contained within the at least one plasma 250, and thus, increases the number of ions that are ejected from the plasma sheath and directed toward the dielectric film. As such, bias power may be applied to increase the ion content (or ion concentration) in the plasma doped dielectric film 232 and/or to increase the penetration depth of the ions in the plasma doped dielectric film 232.

The plasma doping process shown in FIG. 2C may utilize a wide range of bias powers. For example, the bias power supplied to the plasma process chamber may range between 0 W and 100 W, between 100 W and 200 W, between 200 W and 300 W or between 400 W and 500 W. In some embodiments, an optimum bias power to be applied during the plasma doping process shown in FIG. 2C may be selected, for example, based on the dielectric film 230 material and thickness, processing gas(es) supplied to the plasma process chamber, electron density, electron temperature, gas flow ratio, pressure of the plasma, ion flux, ion energy, chamber configurations and/or a desired ion content (or ion concentration) in the plasma doped dielectric film 232. In one embodiment, the bias power may range from 50 W to 500 W In some embodiments, a bias power may be selected to increase the number of ions introduced into the deposited dielectric film 230 during the plasma doping process. In other words, a bias power may increase the ion content (or ion concentration) in the plasma doped dielectric film 232. By increasing the ion content in the plasma doped dielectric film 232, the plasma doping process shown in FIG. 2C may be used to create additional defects (e.g., additional oxygen vacancies in a metal-oxide dielectric) in the plasma doped dielectric film 232 that further reduce the forming voltage. In some embodiments, the forming voltage may be further reduced by about 1.0V to 1.2V by selecting and applying an optimum bias power to the plasma process chamber during the plasma doping process shown in FIG. 2C.

In one embodiment, a $HfO_2$ dielectric film 230 may be deposited to a desired thickness of 2 nm to 20 nm in FIG. 2B. Once deposited to the desired thickness, the $HfO_2$ dielectric film 230 may be exposed to one or more plasmas 250 to produce the plasma doped dielectric film 232 shown in FIG. 2C. One example of process conditions that may be used to produce the plasma doped dielectric film 232 include: gas flows of 50 to 150 standard cubic centimeters per minute (SCCM) $H_2$, 5 to 10 SCCM silicon containing gas and 500 to 2000 SCCM helium (He); pressure 50-200 milliTorr (mT); and microwave (MW) power settings of source power 500-2000 W and bias of 100-300 W. By using such process conditions, the plasma doping process shown in FIG. 2C may maximize the ion content (or ion concentration) in the plasma doped dielectric film 232, so that a forming voltage of about 0.5V to about 1.1V can be achieved in a subsequently performed electroforming step.

FIGS. 2A-2D illustrate one embodiment of a process flow that may be used to form an ReRAM cell 200 having a reduced forming voltage. In the embodiment shown in FIGS. 2A-2D, the dielectric film 230 is exposed to the at least one plasma 250 after the dielectric film 230 is deposited to the desired thickness (such as, e.g., 2 nm to 20 nm). In other embodiments, the uniformity of dopants introduced throughout the dielectric film thickness may be improved by interrupting the deposition of the dielectric film at least once and performing the plasma exposure before continuing the deposition of the dielectric film. In other words, uniformity of dopants introduced throughout the dielectric film thickness may be improved by performing a cyclical process of deposition/doping, as shown for example in FIGS. 3A-3F.

FIGS. 3A-3F illustrate another embodiment of a process flow that may be used to form an ReRAM cell 300 in accordance with the techniques described herein. The process flow shown in FIGS. 3A-3F to form the ReRAM cell 300 includes many of the same layers and process steps used to form the ReRAM cell 200 shown in FIGS. 2A-2D. Similar layers and process steps are designated with similar reference numerals.

FIGS. 3A-3F illustrate the formation of an ReRAM cell stack, including a bottom electrode layer 220, a dielectric film 230 and a top electrode layer 240, on a substrate 210. The substrate 210, the bottom electrode layer 220 and the top electrode layer 240 may generally be formed as described above in reference to FIGS. 2A, 2B and 2D.

Figure 3A:
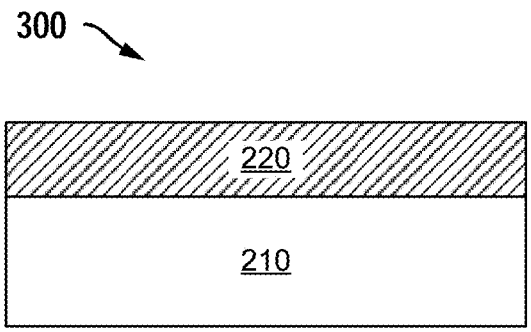
FIGS. 3A-3F illustrate another embodiment of a process flow used to form an ReRAM cell in accordance with the techniques described herein.
Figure 3B:
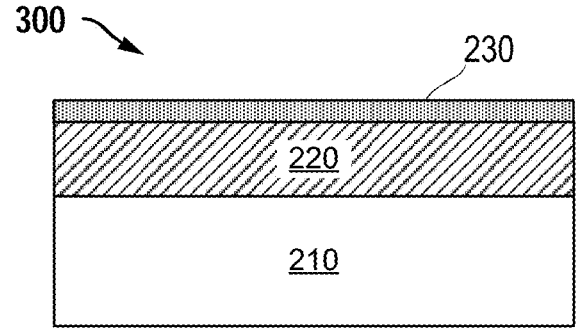

In FIG. 3A, the bottom electrode layer 220 is formed on the substrate 210. In FIG. 3B, the dielectric film 230 is formed on the bottom electrode layer 220 as a blanket dielectric layer. Unlike the previous embodiment shown in FIG. 2B, the dielectric film 230 is initially deposited to a first thickness, which is less than the desired thickness, in the embodiment shown in FIG. 3B. When depositing a 5 nm thick $HfO_2$ dielectric film, for example, the dielectric film 230 shown in FIG. 3B may be initially deposited to a thickness of about 1 nm, 2 nm or 3 nm. Other film thicknesses may be used in FIG. 3, depending on the material and desired thickness of the dielectric film.

Once deposited to the first thickness, the blanket deposited dielectric film 230 may be exposed to at least one plasma 250 to introduce a plurality of co-dopants into the blanket deposited dielectric film 230 to form the plasma doped dielectric film 232. Like the previous embodiment shown in FIG. 2C, the plasma doping process shown in FIG. 3C may utilize a single plasma 250 or a sequence of plasmas 250 to introduce the plurality of different dopants into the first thickness. In one example embodiment, the plasma doping process shown in FIG. 3C may introduce both hydrogen ($H_2$) ions and silicon (Si) ions into the dielectric film 230 when the dielectric film is formed of hafnium oxide ($HfO_2$). Although $H_2$ and Si ions are provided herein as example co-dopants, one skilled in the art would recognize how other combinations of dopants may be used when plasma doping other dielectric films.

Figure 3C:
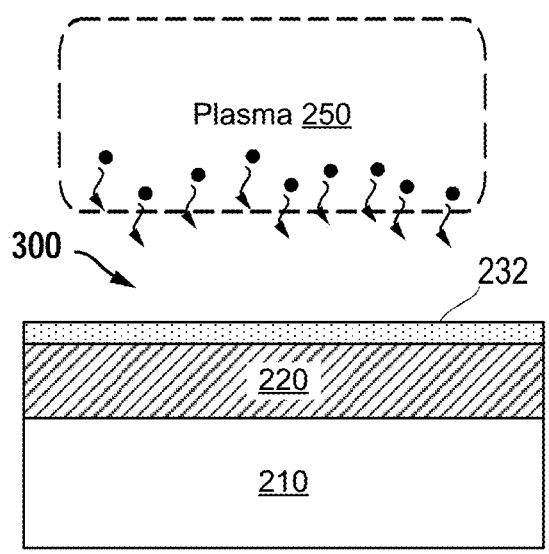
Figure 3D:
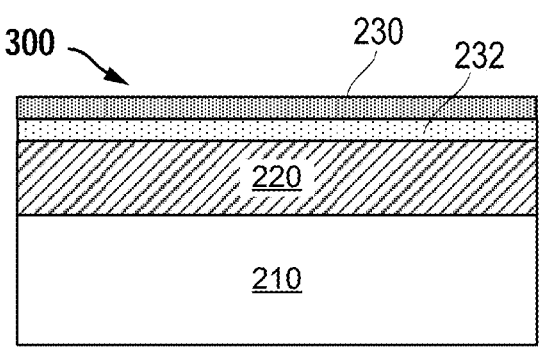

After the dielectric film 230 is exposed to at least one plasma 250 in FIG. 3C, the deposition process may continue by depositing the dielectric film 230 to a second thickness, which is greater than the first thickness. For example, the dielectric film 230 shown in FIG. 3D may again be deposited as a blanket dielectric layer to a thickness of about 1 nm, 2 nm or 3 nm. Other film thicknesses may be used in FIG. 3D, depending on the material, the first thickness and the desired thickness of the metal-oxide dielectric film.

Once deposited to the second thickness, the blanket deposited dielectric film 230 may again be exposed to at least one plasma 250 to introduce a plurality of co-dopants (e.g., $H_2$ and Si ions) into the blanket deposited dielectric film 230 to form the plasma doped dielectric film 232. Like the previous embodiments shown in FIGS. 2C and 3C, the plasma doping process shown in FIG. 3E may utilize a single plasma 250 or a sequence of plasmas 250 to introduce the plurality of different dopants into the second thickness.

Figure 3E:
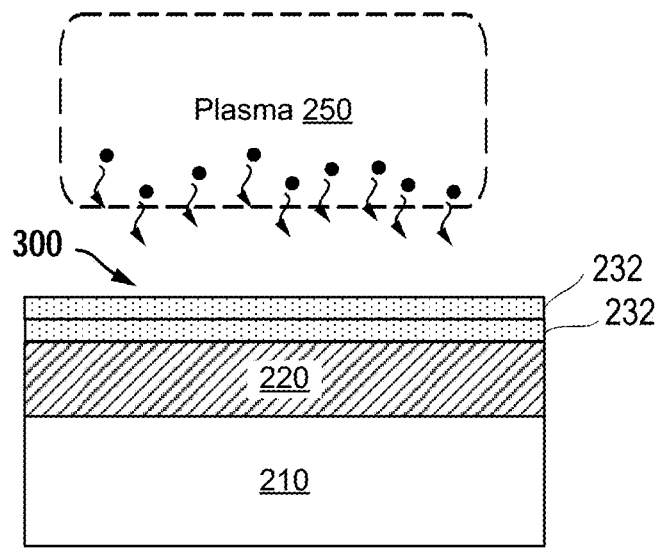
Figure 3F:
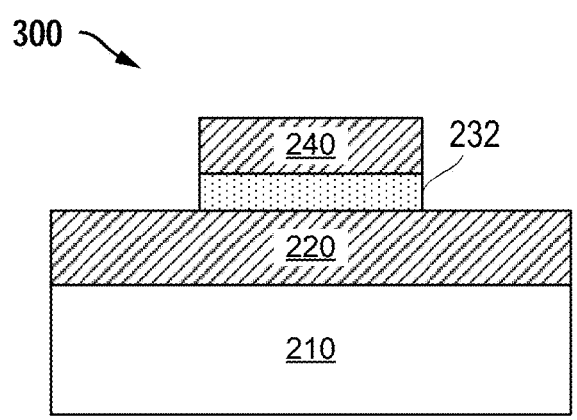

In some embodiments, the top electrode layer 240 may be formed on the plasma doped dielectric film 232 and the plasma doped dielectric film 232 and top electrode layer 240 may be patterned to complete the ReRAM cell stack shown in FIG. 3F after the plasma doping process shown in FIG. 3E is performed. In other embodiments, the cyclical process of depositing a blanket dielectric film 230 (FIGS. 3B, 3D) and exposing the blanket deposited dielectric film 230 to at least one plasma 250 to form the plasma doped dielectric film 232 (FIGS. 3C, 3E) may be repeated one or more times until a desired thickness of the dielectric film is deposited and doped. After the desired thickness is reached, the top electrode layer 240 is deposited onto the plasma doped dielectric film 232, and the plasma doped dielectric film 232 and top electrode layer 240 may be patterned, additional processing steps may be performed to complete the ReRAM cell 300, as is known in the art.

A wide range of plasma processing systems and process conditions may be utilized to perform the plasma doping process shown in FIGS. 3C and 3E. In one embodiment, a microwave plasma processing system may be used to generate the at least one plasma 250 in FIGS. 3C and 3E. As noted above with regard to FIG. 2C, the at least one plasma 250 shown in FIGS. 3C and 3E may be generated by delivering a variety of processing gases to the plasma process chamber, while supplying power from one or more power sources (e.g., source and/or bias power sources) to one or more electrodes contained within the plasma process chamber. The processing gases, power sources and process conditions may be generally configured as described above with reference to FIG. 2C.

As noted above, an optimum bias power may be selected to increase the number of ions introduced into the deposited dielectric film 230 during the plasma doping processes shown in FIGS. 2C, 3C and 3E. As noted above, an optimum bias power may be selected, based on the dielectric film 230 material and thickness, processing gas(es) supplied to the plasma process chamber, electron density, electron temperature, gas flow ratio, pressure of the plasma, ion flux, ion energy, chamber configurations and/or a desired ion content (or ion concentration) in the plasma doped dielectric film 232. In some embodiments, a bias power may be separately selected for each dopant. In other embodiments, one bias power may be selected for all dopants.

Figure 4:
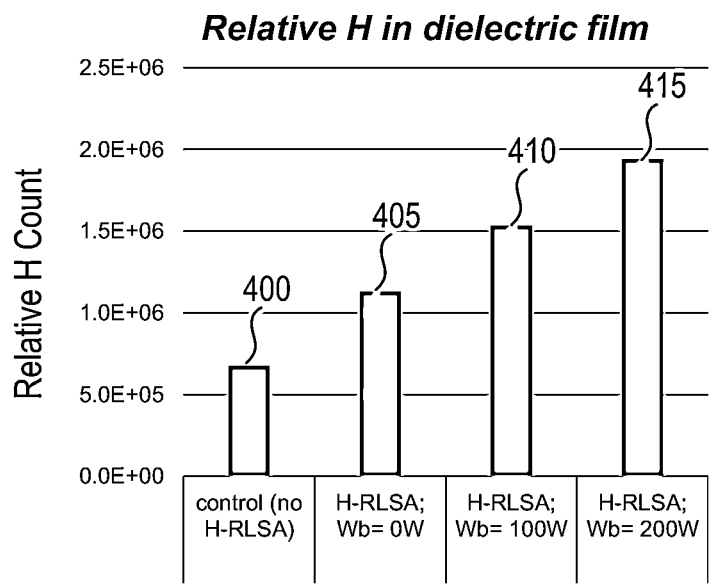
FIG. 4 is a graph illustrating the relative hydrogen count measured in the dielectric film of an ReRAM cell after various plasma process conditions have been used to introduce a hydrogen dopant into the dielectric film.

FIG. 4 is a graph illustrating the relative hydrogen (H) count measured in a plasma doped dielectric film 232 of an ReRAM cell 200/300 after various plasma process conditions have been used to introduce a hydrogen dopant into the deposited dielectric film 230. In particular, the graph shown in FIG. 4 illustrates various H counts (405, 410 and 415) measured in the plasma doped dielectric film 232 after the deposited dielectric film 230 is exposed to a hydrogen-containing microwave plasma under different bias conditions (e.g., 0 W, 100 W and 200 W, respectively). The various H counts (405, 410 and 415) measured in the plasma doped dielectric film 232 are compared in FIG. 4 to an H count (400) measured in the deposited dielectric film 230. As shown in FIG. 4, the relative H counts (405, 410 and 415) measured in the plasma doped dielectric film 232 generally increase with increasing bias power, but may level off or start to decrease past a certain bias power (not shown in FIG. 4). When the bias power increases, the ion energy in the plasma increases, causing more ions to penetrate into the deposited dielectric film 230. An optimal bias power may generally be selected based on the electrical performance of the resulting ReRAM device. In some embodiments, the bias power (e.g., 200 W) that results in the lowest forming voltage may be selected as the optimum bias power.

Figure 5:
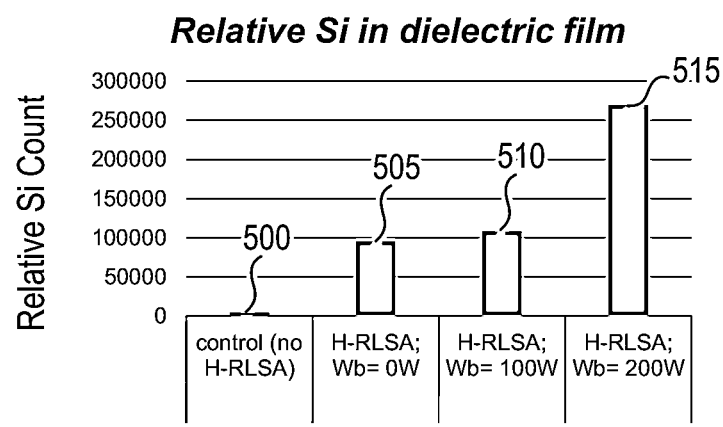
FIG. 5 is a graph illustrating the relative silicon count measured in the dielectric film of an ReRAM cell after various plasma process conditions have been used to introduce a silicon dopant into the dielectric film.

FIG. 5 is a graph illustrating the relative silicon (Si) count measured in a plasma doped dielectric film 232 of an ReRAM cell 200/300 after various plasma process conditions have been used to introduce a silicon dopant into the deposited dielectric film 230. In particular, the graph shown in FIG. 5 illustrates various Si counts (505, 510 and 515) measured in the plasma doped dielectric film 232 after the deposited dielectric film 230 is exposed to a silicon-containing microwave plasma under different bias conditions (e.g., 0 W, 100 W and 200 W, respectively). The various Si counts (505, 510 and 515) measured in the plasma doped dielectric film 232 are compared in FIG. 5 to a Si count (500) measured in the deposited dielectric film 230. As shown in FIG. 5, the relative Si counts (505, 510 and 515) measured in the plasma doped dielectric film 232 generally increase with increasing bias power, but may level off or start to decrease past a certain bias power (not shown in FIG. 5). When the bias power increases, the ion energy in the plasma increases, causing more ions to penetrate into the deposited dielectric film 230. Although very little difference is seen between Si count 505 (0 W bias power) and Si count 510 (100 W bias power), a significant increase in Si count 515 is obtained by increasing the bias power to 200 W. An optimal bias power may generally be selected based on the electrical performance of the resulting ReRAM device. In some embodiments, the bias power (e.g., 200 W) that results in the lowest forming voltage may be selected as the optimum bias power.

Figure 6:
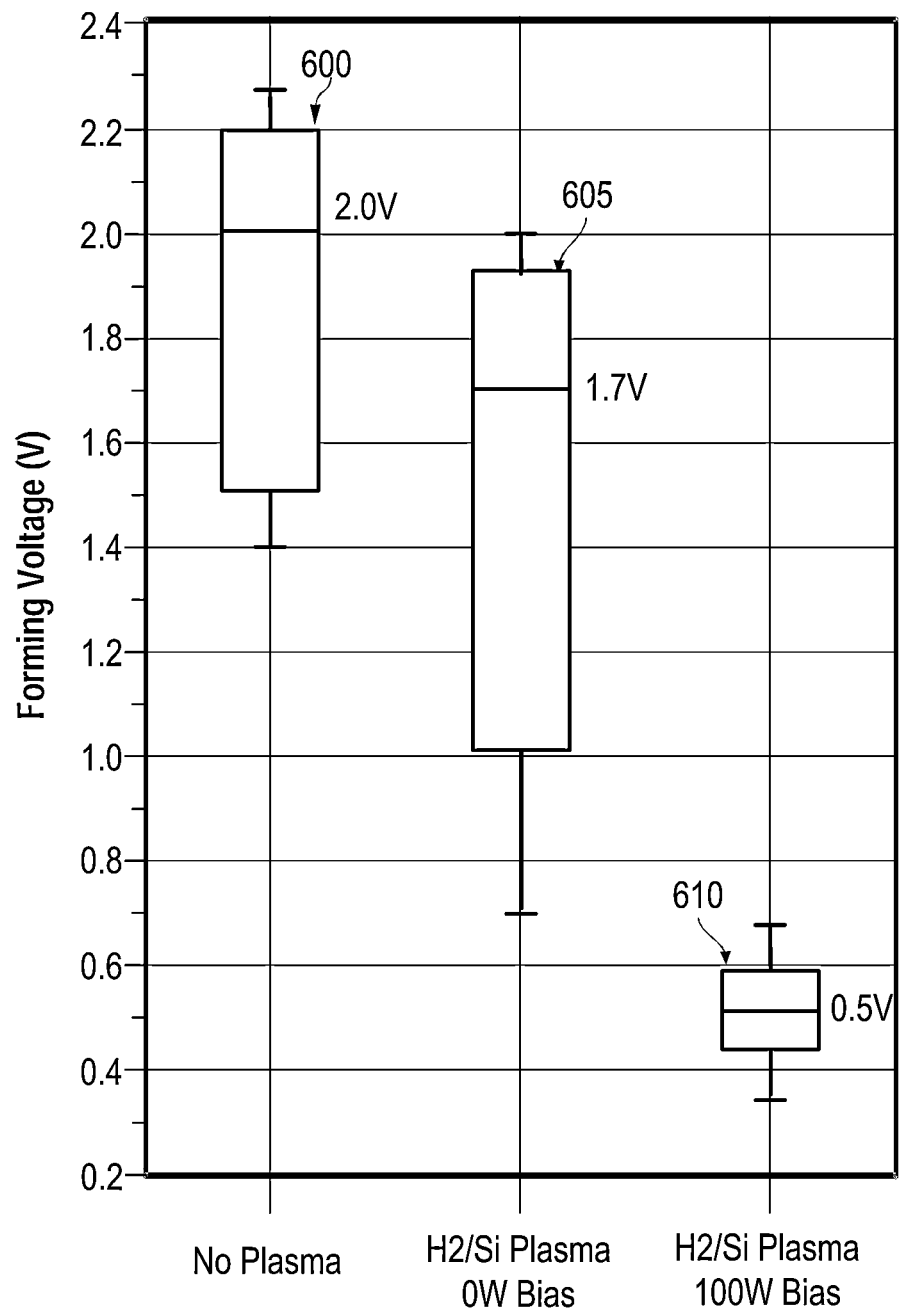
FIG. 6 is a graph illustrating exemplary forming voltages achieved in a 40 um ReRAM cell under different plasma process conditions.
Figure 7:
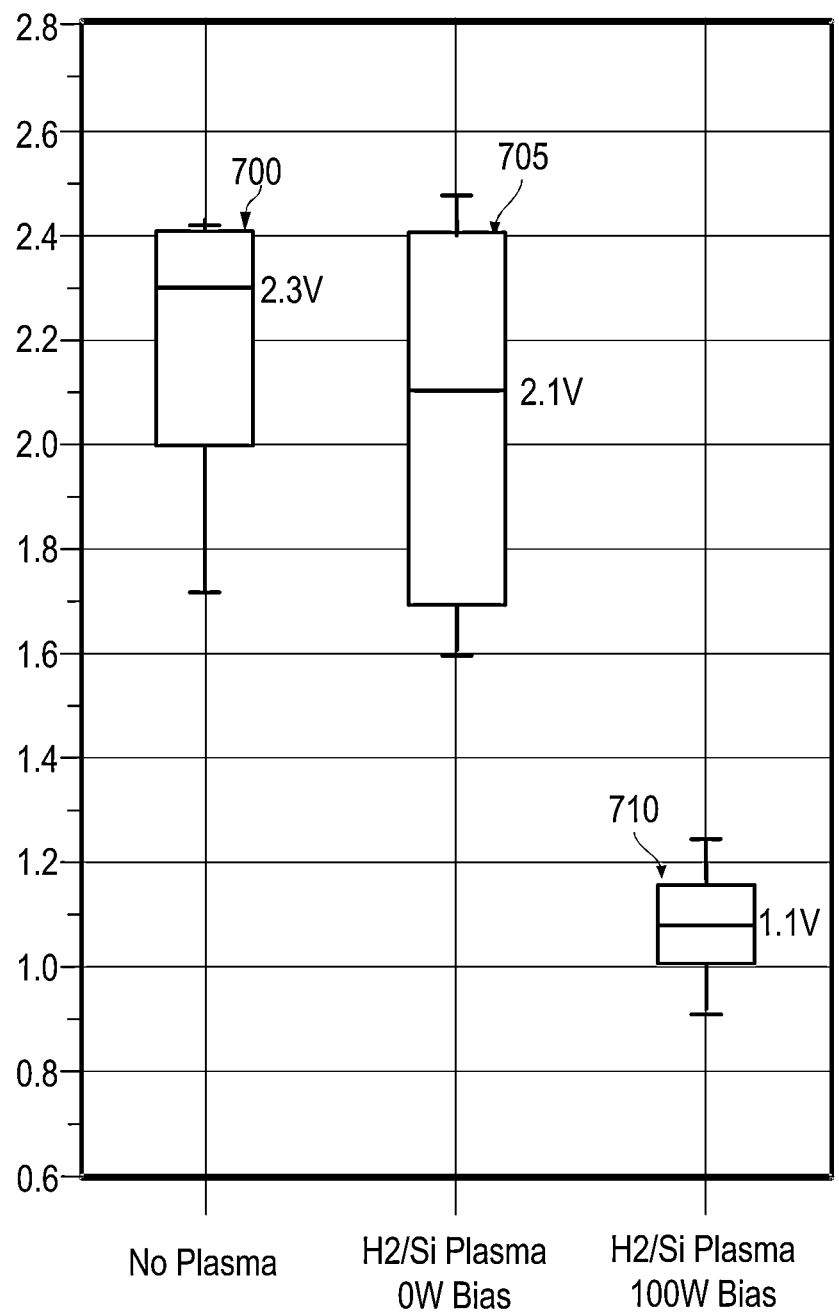
FIG. 7 is a graph illustrating exemplary forming voltages achieved in a 100 um ReRAM cell under different plasma process conditions.

FIGS. 6 and 7 provide exemplary forming voltages obtained from a variety of ReRAM process flows. FIG. 6 illustrates forming voltages achieved in an exemplary 40 um ReRAM cell comprising a 100 nm TiN top electrode layer, a 5 nm $HfO_2$ dielectric film and a 20 nm TiN bottom electrode layer under different process conditions. Forming voltages achieved in an exemplary 100 um ReRAM cell comprising a 20 nm TiN top electrode layer, a 5 nm $HfO_2$ dielectric film and a 20 nm TiN bottom electrode are illustrated in FIG. 7 for the same process conditions. After depositing the $HfO_2$ dielectric film dielectric film, the deposited dielectric film was exposed to: (a) no dopants (an absence of plasma) (in graphs 600 and 700), (b) $H_2$/Si plasma(s) generated without bias power (e.g., 0 W bias power) (in graphs 605 and 705), and (c) $H_2$/Si plasma(s) generated with bias power (e.g., 100 W bias power) (in graphs 610 and 710).

As shown in FIG. 6, a forming voltage (600) of 2.0V (median) was achieved in the 40 um ReRAM cell when the deposited $HfO_2$ dielectric film was not exposed to a plasma. When the deposited $HfO_2$ dielectric film was exposed to at least one $H_2$/Si plasma generated with 0 W bias power, the forming voltage (605) achieved in the 40 um ReRAM cell was reduced by about 0.3V (e.g., from 2.0V to 1.7V). The forming voltage (610) was further reduced by about 1.2V (e.g., from 1.7V to 0.5V) when a bias power (e.g., 100 W bias power) was used to generate the at least one $H_2$/Si plasma.

As shown in FIG. 7, a forming voltage (700) of 2.3V was achieved in the 100 um ReRAM cell when the deposited $HfO_2$ dielectric film was not exposed to a plasma. When the deposited $HfO_2$ dielectric film was exposed to at least one $H_2$/Si plasma generated with 0 W bias power, the forming voltage (705) achieved in the 100 um ReRAM cell was reduced by about 0.2V (e.g., from 2.3V to 2.0V). The forming voltage (710) was further reduced by about 1.0V (e.g., from 2.1V to 1.1V) when a bias power (e.g., 100 W bias power) was used to generate the at least one $H_2$/Si plasma.

As can be seen from FIGS. 6 and 7, the use of at least one plasma containing both $H_2$ and Si co-dopants improves the forming voltages (605 and 705) versus conventional methods. Forming voltages (610 and 710) are further reduced in FIGS. 6 and 7 by applying a bias voltage during the plasma doping process. The reduction in forming voltage improves ReRAM device performance by reducing the electrical stress placed on the ReRAM cell and improving RERAM cell switching characteristics. In some embodiments, the techniques described herein may be used to achieve forming voltages close to the switching voltages of the ReRAM cell, and thus, may be used to create a nearly forming-free (or pre-formed) ReRAM cell.

As mentioned above, the techniques described herein may be used to form a variety of ReRAM cells within a variety of ReRAM process flows. The particular composition of the various layers may vary as would be known by those skilled in the art. Thus, other types of materials may be utilized for the various RERAM layers while still obtaining the benefits of the techniques described herein.

Figure 8:
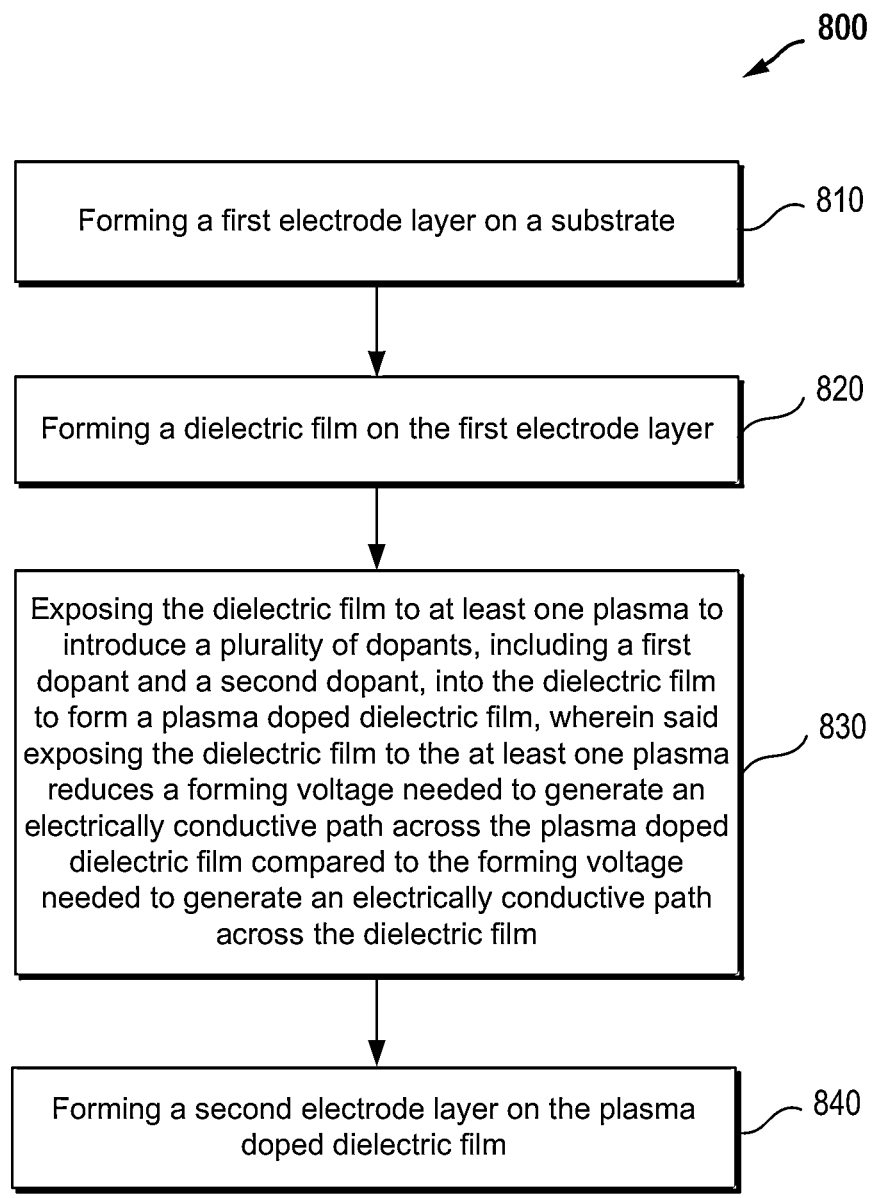
FIGS. 8 and 9 illustrate exemplary embodiments of methods that utilize the techniques described herein to reduce the forming voltage of an ReRAM cell.
Figure 9:
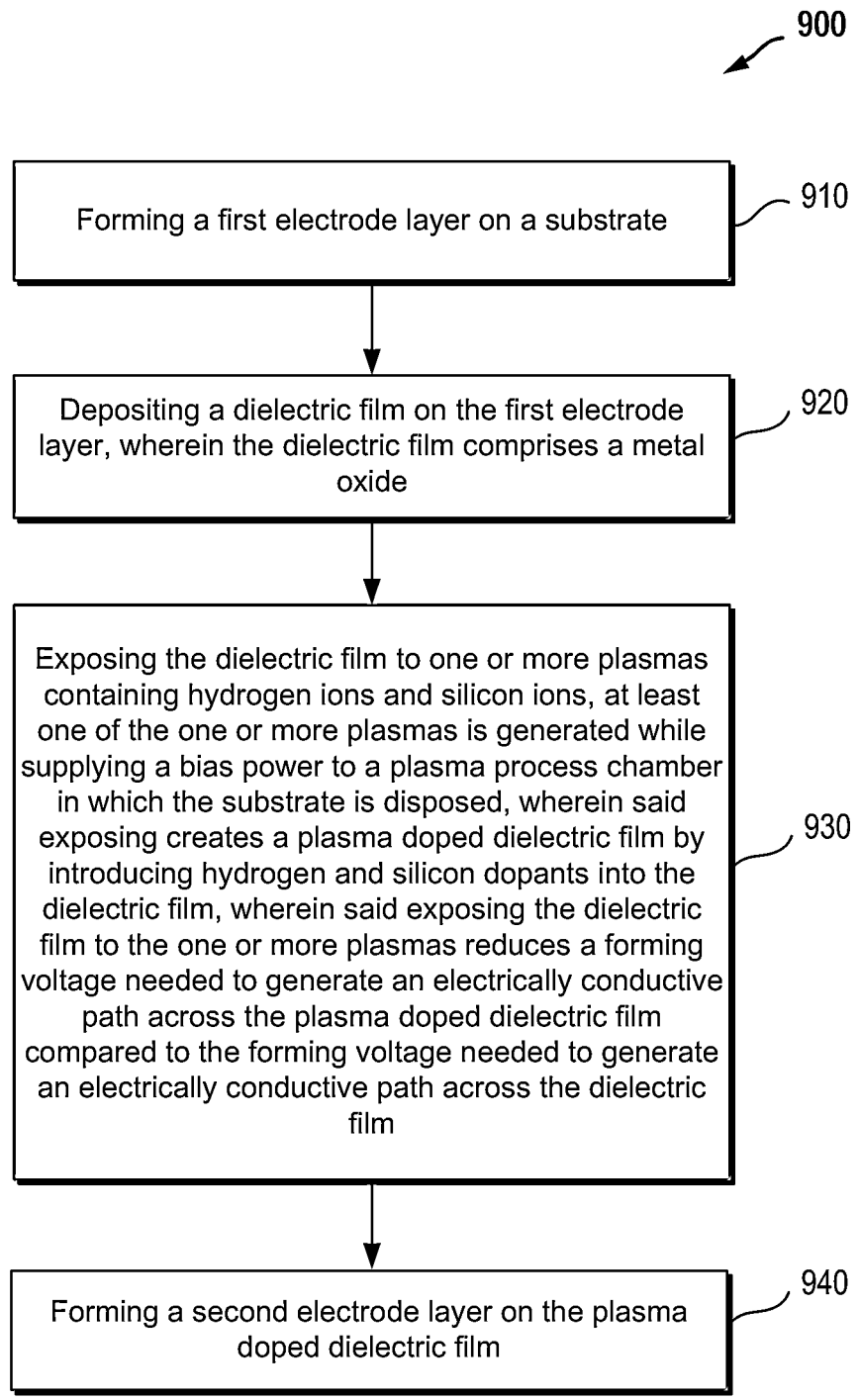

FIGS. 8 and 9 illustrate exemplary methods for use of the processing techniques described herein. It will be recognized that the embodiments of FIGS. 8 and 9 are merely exemplary and additional methods may utilize the techniques described herein. Further, additional processing steps may be added to the methods shown in the FIGS. 8 and 9 as the steps described are not intended to be exclusive. Moreover, the order of the steps is not limited to the order shown in FIGS. 8 and 9 as different orders may occur and/or various steps may be performed in combination or at the same time.

FIG. 8 illustrates a first exemplary method 800 of forming a resistive random access memory (ReRAM) device. The method 800 comprises: forming a first electrode layer on a substrate (in step 810); forming a dielectric film on the first electrode layer (in step 820); exposing the dielectric film to at least one plasma to introduce a plurality of dopants, including a first dopant and a second dopant, into the dielectric film to form a plasma doped dielectric film (in step 830); and forming a second electrode layer on the plasma doped dielectric film (in step 840). By exposing the dielectric film to the at least one plasma (in step 830), the method 800 reduces a forming voltage needed to generate an electrically conductive path across the plasma doped dielectric film compared to the forming voltage needed to generate an electrically conductive path across the dielectric film.

FIG. 9 illustrates a second exemplary method 900 of forming a resistive random access memory (ReRAM) device. The method 900 comprises: forming a first electrode layer on a substrate (in step 910); depositing a dielectric film on the first electrode layer, wherein the dielectric film comprises a metal oxide (in step 920); exposing the dielectric film to one or more plasmas containing hydrogen ions and silicon ions (in step 930), wherein at least one of the one or more plasmas is generated while supplying a bias power to a plasma process chamber in which the substrate is disposed, and wherein said exposing creates a plasma doped dielectric film by introducing hydrogen and silicon dopants into the dielectric film; and forming a second electrode layer on the plasma doped dielectric film (in step 940). By exposing the dielectric film to the one or more plasmas (in step 930), the method 900 reduces a forming voltage needed to generate an electrically conductive path across the plasma doped dielectric film compared to the forming voltage needed to generate an electrically conductive path across the dielectric film.

Figure 10:
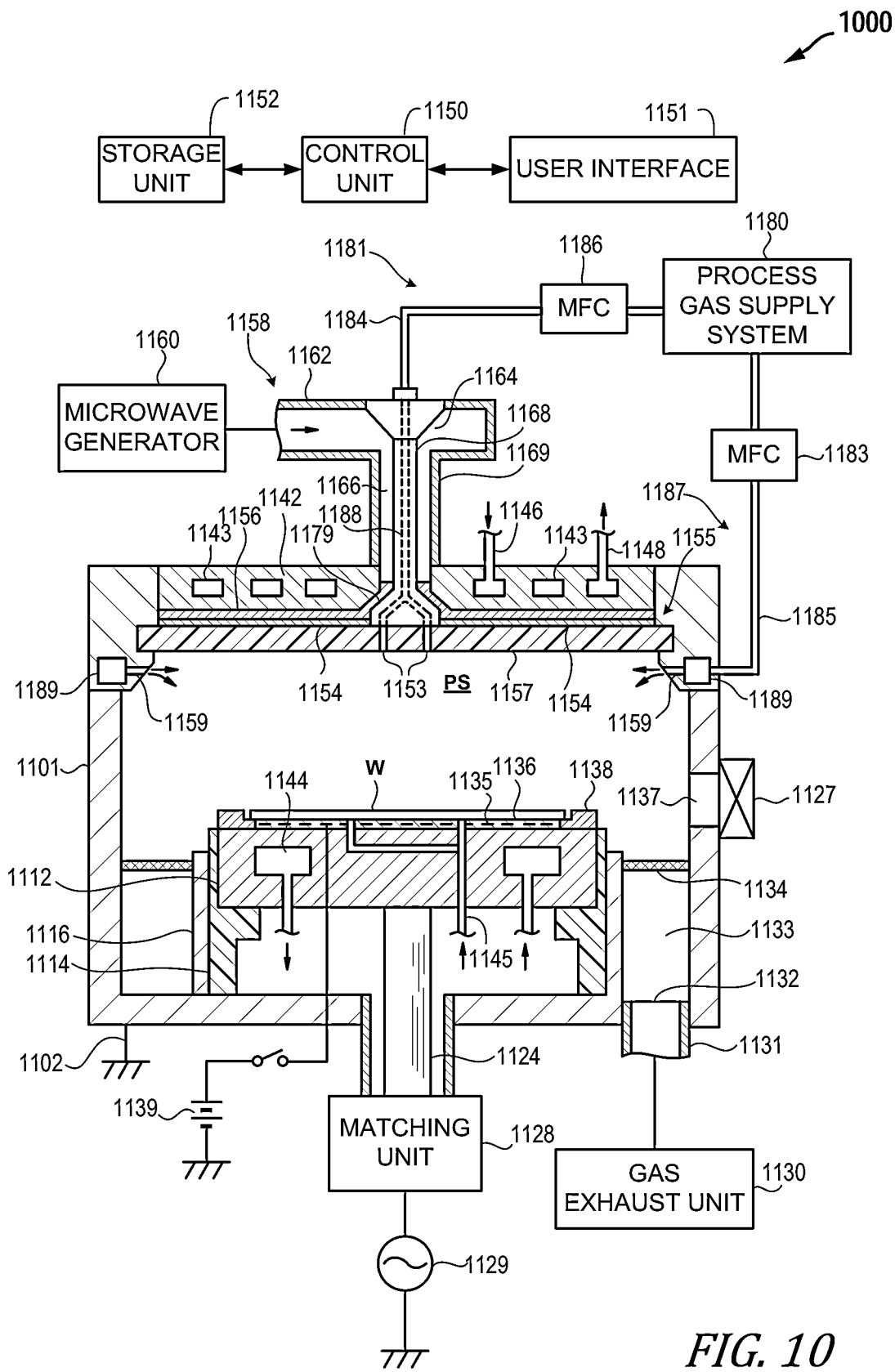
FIG. 10 is a block diagram of an exemplary plasma processing system.

As noted above, the techniques described herein may be utilized within a wide range of plasma processing systems. FIG. 10 provides one example embodiment of a plasma processing system 1000 that can be used with respect to the disclosed techniques and is provided for illustrative purposes only. Although the plasma processing system 1000 shown in FIG. 1000 is a microwave plasma processing system, one skilled in the art would recognize the techniques described herein could be performed in a microwave plasma processing system, an inductively coupled plasma (ICP) processing system, a capacitively coupled plasma (CCP) processing system, an electron cyclotron resonance (ECR) plasma processing system, or other type of processing system or combination of systems. Thus, it will be recognized by those skilled in the art that the techniques described herein may be utilized with any of a wide variety of plasma processing systems. The plasma processing system 1000 shown in FIG. 10 can also be used for a wide variety of operations including, but not limited to, etching, deposition, cleaning, plasma polymerization, plasma-enhanced chemical vapor deposition (PECVD), atomic layer deposition (ALD) and so forth.

Looking in more detail to FIG. 1000, the plasma processing system 1000 includes a processing chamber 1101. The processing chamber 1101 can be a cylindrical vacuum chamber made of a metal (e.g., aluminum or stainless steel), which is grounded by a ground wire 1102. The processing chamber 1101 defines a processing vessel providing a process space (PS) for plasma generation. An inner wall of the processing vessel can be coated with alumina, yttria, or another protectant.

At a lower, central area within the processing chamber 1101, a susceptor 1112 (which can be disc-shaped) can serve as a mounting table on which, for example, a substrate W to be processed (e.g., a semiconductor wafer) can be mounted. Substrate W can be moved into the processing chamber 1101 through loading/unloading port 1137 and gate valve 1127. An electrostatic chuck 1136 is provided on a top surface of the susceptor 1112. An electrode 1135 is provided within the susceptor 1112 and electrically connected to DC power source 1139 (direct current power source). The electrostatic chuck 1136 attracts the substrate W thereto via an electrostatic force generated when DC voltage from the DC power source 1139 is applied to the electrode 1135 so that substrate W is securely mounted on the susceptor 1112.

A high-frequency power source 1129 for RF bias is electrically connected to the susceptor 1112, or the electrode 1135, through a matching unit 1128 (to match impedance) and a power feeding rod 1124. The high-frequency power source 1129 outputs high frequency waves of a frequency suitable for controlling the energy of ions drawn into the substrate W. For example, high frequency waves of 13.56 MHz or other power can be used for attracting ions. A focus ring 1138 is provided radially outside the electrostatic chuck 1136 to annually surround the substrate W.

A coolant flow path 1144 can extend, for example, in a circumferential direction, within susceptor 1112 and can be configured to receive circulated coolant to help control a processing temperature of the substrate (W) on the electrostatic chuck 1136. Additionally, heat transfer gas from a heat transfer gas supply unit (not illustrated) can be supplied to a space between a top surface of the electrostatic chuck 1136 and a rear surface of the substrate W through a gas supply line 1145.

An exhaust path 1133 can be formed along an outer periphery of support unit 1114 and/or conductive support unit 1116 and an inner wall of the processing chamber 1101 in which an annular baffle plate 1134 is attached to the top or inlet of the exhaust path 1133 and an exhaust port 1132 (or multiple exhaust ports), which is provided in a bottom portion of the exhaust path 1133. A gas exhaust unit 1130 is connected to each exhaust port 1132 through gas exhaust line 1131, which can have multiple exhaust lines. The gas exhaust unit 1130 can include a vacuum pump such as a turbo molecular pump configured to decompress the plasma processing space within the processing chamber 1101 to a desired vacuum condition.

An upper portion of the microwave plasma processing apparatus will now be described. A dielectric window 1157 can be configured to introduce microwaves and function as a ceiling plate. A space just below the dielectric window 1157 within the processing chamber 1101 serves as a plasma generation space as process space PS. The dielectric window 1157 can be made of a microwave-permeable dielectric material such as, for example, quartz or ceramics such as aluminum oxide, and can have a thickness of, for example, about 20 mm or sufficient for pressure resistance. The dielectric window 1157 can be provided with a slot plate 1154 which can be a conductor attached to, or disposed on, a top surface of the dielectric window 1157. The slot plate 1154 can have a plurality of slot pairs that are configured to irradiate microwaves distributed concentrically in a rotationally symmetric arrangement, though other geometric configurations can be used. On the slot plate 1154, a dielectric plate 1156 can shorten the wavelength of microwaves propagated inside the slot plate 1154. The slot plate 1154 is electromagnetically coupled to a microwave transmission line 1158. A slot antenna 1155, which can be a flat plate-type slot antenna, for example, or a disc-shaped, radial line slot antenna, can include the slot plate 1154, the dielectric plate 1156, and an antenna rear plate (not shown) provided to be opposite to the slot plate 1154.

The microwave transmission line 1158 is a line configured to transmit, for example, microwaves of 2.45 GHz (or other frequency), which are output from a microwave generator 1160 with a predetermined power, to the slot antenna 1155, and can include a waveguide 1162, a waveguide-coaxial line converter 1164, and a coaxial tube 1166. The waveguide 1162 can be, for example, a rectangular waveguide configured to transmit microwaves from the microwave generator 1160 to the waveguide-coaxial line converter 1164. The coaxial tube 1166 extends vertically downward from the waveguide-coaxial line converter 1164 to the central portion of the top of the processing chamber 1101 and a terminal end of the coaxial tube 1166 is coupled to the slot antenna 1155 through the dielectric plate 1156. An outer conductor 1169 and an inner conductor 1168 can define a space for wave transmission. A connector unit 1179 is connected to the lower end of the inner conductor 1168.

In addition, the microwaves expanded in a radial direction while being shortened in wavelength within the dielectric plate 1156 become plane waves of circular polarization having two orthogonal polarization components from each slot pair of the slot antenna 1155 and are radiated toward the inside of the processing chamber 1101. Process gas in the vicinity of the surface of the dielectric window 1157 is then ionized by the electric fields of surface waves (microwave electric fields) propagated in the radial direction along the surface of the dielectric window 1157 and, as a result, high-density and low-electronic temperature plasma is generated.

The dielectric plate 1156 can include a cooling jacket plate 1142, which can serve as an antenna rear plate to cover a top of the processing chamber 1101. The cooling jacket plate 1142 can be configured to absorb heat (radiating) of dielectric loss which is generated from the dielectric window 1157 and the dielectric plate 1156. To provide cooling, a coolant can be circulated in a flow path 1143, and fed and removed through conduit 1146 and conduit 1148.

The microwave plasma processing apparatus can include two routes for process gas introduction. Upper gas introduction section 1181 includes a gas flow path provided in the dielectric window 1157, and a side gas introduction section 1187 that includes a gas flow path provided in a side wall of the processing chamber 1101, as a gas introduction mechanism configured to introduce a processing gas into the processing chamber 1101.

In the upper gas introduction section 1181, a gas flow path 1188 is provided in the inner conductor 1168 of the coaxial tube 1166 to extend in an axial direction through the inside of the inner conductor 1168. Additionally, a first gas supply line 1184 from a process gas supply system 1180 is connected to the upper end of the inner conductor 1168 and the gas flow path 1188 of the first gas supply line 1184. The connector unit 1179 can have a plurality of internal flow paths which are bored and radially branched from a common inlet. The connector unit 1179 can be made of a conductor, and can be electrically grounded. The dielectric window 1157 can be formed with inner flow paths connected to the terminal ends of a branched gas supply paths such as for process gas to vertically pass through the dielectric window 1157 to face the plasma generation space within the processing chamber 1101.

In the upper gas introduction section 1181, a processing gas, which is pumped from the process gas supply system 1180 at a predetermined pressure (for example, an etching gas or a film-forming gas), flows through the first gas supply line 1184, the gas flow path 1188 of the coaxial tube 1166, and is ejected from each gas jet port 1153 at the terminal end. A mass flow controller (MFC) 1186 and corresponding valve can be used for opening/closing and metering process gas flow in first gas supply line 1184.

The side gas introduction section 1187 is placed at a position lower than a bottom surface of the dielectric window 1157, and can include a buffer chamber 1189 (manifold), sidewall gas jet ports 1159, and a second gas supply line 1185 extending from the process gas supply system 1180 to the buffer chamber 1189. A mass flow controller 1183 and corresponding valve can be used for opening/closing and metering process gas flow in second gas supply line 1185. Process gas from side gas introduction section 1187 can be jetted in a substantially horizontal flow from the respective sidewall gas jet ports 1159 to be diffused in the process space PS.

Components of the plasma processing apparatus can be connected to, and controlled by, a control unit 1150, which in turn can be connected to a corresponding storage unit 1152 and user interface 1151. Control unit 1150 can include a microcomputer configured to control operation of each of the components within the microwave plasma processing apparatus such as, for example, the gas exhaust unit 1130, the high-frequency power source 1129, DC power source 1139 for the electrostatic chuck 1136, microwave generator 1160, the upper gas introduction section 1181, the side gas introduction section 1187, the process gas supply system 1180, and a heat transfer gas supply unit (not illustrated) or the operations of the entire apparatus. Various plasma processing operations can be executed via the user interface 1151, and various plasma processing recipes and operations can be stored in the storage unit 1152. Accordingly, a given substrate can be processed within the plasma processing chamber with various microfabrication techniques.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken only as exemplary embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of forming a resistive random access memory (ReRAM) device, the method comprising:
    forming a first electrode layer on a substrate;
    forming a dielectric film on the first electrode layer, wherein the dielectric film comprises a metal oxide;
    exposing the dielectric film to at least one plasma to introduce a plurality of dopants, including a hydrogen dopant and a silicon dopant, into the dielectric film to form a plasma doped dielectric film; and
    forming a second electrode layer on the plasma doped dielectric film;
    wherein said exposing the dielectric film to the at least one plasma reduces a forming voltage needed to generate an electrically conductive path across the plasma doped dielectric film compared to the forming voltage needed to generate an electrically conductive path across the dielectric film.

2. The method of claim 1, the first electrode layer and the second electrode layer comprise titanium nitride (TiN).

3. The method of claim 1, wherein the metal oxide comprises hafnium oxide ($HfO_2$), zirconium oxide ($ZrO_2$), titanium oxide ($TiO_2$), nickel oxide (NiO), aluminum oxide ($Al_2O_3$), or tantalum oxide ($Ta_2O_5$) and or their mixtures.

4. The method of claim 1, wherein said exposing the dielectric film to the at least one plasma comprises exposing the dielectric film to a single plasma comprising both hydrogen ions and silicon ions.

5. The method of claim 1, wherein said exposing the dielectric film to the at least one plasma comprises exposing the dielectric film to a sequence of plasmas, the sequence of plasmas including a first plasma comprising hydrogen ions and a second plasma comprising silicon ions.

6. The method of claim 1, wherein said exposing the dielectric film to the at least one plasma comprises delivering a hydrogen-containing processing gas and a silicon-containing processing gas to a plasma process chamber in which the substrate is disposed to generate the at least one plasma.

7. The method of claim 6, wherein the hydrogen-containing processing gas comprises a hydrogen ($H_2$) gas or an $H_2$ gas combined with one or more inert gases, and wherein the silicon-containing processing gas comprises a perhydrosilane, a hydridohalosilane, a halosilane or an aminosilane.

8. The method of claim 6, wherein the hydrogen-containing processing gas and the silicon-containing processing gas are delivered to the plasma process chamber at the same time to generate a single plasma containing both hydrogen ions and silicon ions.

9. The method of claim 6, wherein the hydrogen-containing processing gas and the silicon-containing processing gas are delivered to the plasma process chamber sequentially to generate a sequence of plasmas, and wherein each plasma in the sequence of plasmas contains only one reactive ion species.

10. The method of claim 6, wherein said exposing the dielectric film to the at least one plasma comprises supplying a bias power to the plasma process chamber to increase an ion content in the plasma doped dielectric film.

11. The method of claim 10, wherein the bias power is preselected from a range consisting of 50 W to 500 W.

12. The method of claim 11, wherein said supplying the bias power to the plasma process chamber to increase the ion content in the plasma doped dielectric film further reduces the forming voltage needed to generate the electrically conductive path across the plasma doped dielectric film.

13. The method of claim 6, wherein said forming the dielectric film and said exposing the dielectric film to the at least one plasma are performed in the same plasma process chamber.

14. A method of forming a resistive random access memory (ReRAM) device, the method comprising:
    forming a first electrode layer on a substrate;
    depositing a dielectric film on the first electrode layer, wherein the dielectric film comprises a metal oxide;
    exposing the dielectric film to one or more plasmas containing hydrogen ions and silicon ions, wherein at least one of the one or more plasmas is generated while supplying a bias power to a plasma process chamber in which the substrate is disposed, and wherein said exposing creates a plasma doped dielectric film by introducing hydrogen and silicon dopants into the dielectric film; and
    forming a second electrode layer on the plasma doped dielectric film;
    wherein said exposing the dielectric film to the one or more plasmas reduces a forming voltage needed to generate an electrically conductive path across the plasma doped dielectric film compared to the forming voltage needed to generate an electrically conductive path across the dielectric film.

15. The method of claim 14, wherein the metal oxide comprises hafnium oxide ($HfO_2$), zirconium oxide ($ZrO_2$), titanium oxide ($TiO_2$), nickel oxide (NiO), aluminum oxide ($Al_2O_3$), or tantalum oxide ($Ta_2O_5$) or their mixtures.

16. The method of claim 14, wherein after said exposing the dielectric film to the one or more plasmas and before said forming the second electrode layer on the plasma doped dielectric film, the method further comprises:
    depositing an additional dielectric film on the plasma doped dielectric film, wherein the additional dielectric film comprises the metal oxide;
    exposing the additional dielectric film to one or more plasmas containing hydrogen ions and silicon ions to introduce hydrogen and silicon dopants into the additional dielectric film; and
    repeating said depositing an additional dielectric film and said exposing the additional dielectric film to one or more plasmas until a desired thickness of the plasma doped dielectric film is reached.

17. The method of claim 14, wherein said exposing the dielectric film to the one or more plasmas comprises delivering a hydrogen-containing processing gas and a silicon-containing processing gas to the plasma process chamber to generate the one or more plasmas.

18. The method of claim 17, wherein the hydrogen-containing processing gas and the silicon-containing processing gas are delivered to the plasma process chamber at the same time to generate a single plasma containing both the hydrogen ions and the silicon ions.

19. The method of claim 17, wherein the hydrogen-containing processing gas and the silicon-containing processing gas are delivered to the plasma process chamber sequentially to generate a sequence of plasmas, and wherein each plasma in the sequence of plasmas contains only one reactive ion species.

20. The method of claim 14, wherein the bias power is preselected from a range consisting of 50 W to 500 W.

21. The method of claim 14, wherein said supplying the bias power to the plasma process chamber increases an ion content in the plasma doped dielectric film and further reduces the forming voltage needed to generate the electrically conductive path across the plasma doped dielectric film.

* * * * *